(12) United States Patent
Suleski et al.

(10) Patent No.: US 6,869,754 B2
(45) Date of Patent: Mar. 22, 2005

(54) TRANSFER OF OPTICAL ELEMENT PATTERNS ON A SAME SIDE OF A SUBSTRATE ALREADY HAVING A FEATURE THEREON

(75) Inventors: Thomas J. Suleski, Charlotte, NC (US); Robert Russell Boye, Charlotte, NC (US); William Delaney, Charlotte, NC (US); Harris Miller, Charlotte, NC (US); James Morris, Charlotte, NC (US); Hongtao Han, Mooresville, NC (US); Jay Mathews, Huntersville, NC (US)

(73) Assignee: Digital Optics Corp., Charlotte, NC (US)

( * ) Notice: Subject to any disclaimer, the term of this patent is extended or adjusted under 35 U.S.C. 154(b) by 96 days.

(21) Appl. No.: 09/994,867

(22) Filed: Nov. 28, 2001

(65) Prior Publication Data

US 2003/0076589 A1 Apr. 24, 2003

Related U.S. Application Data

(60) Provisional application No. 60/330,504, filed on Oct. 23, 2001.

(51) Int. Cl.$^7$ ............................................... G02B 27/42
(52) U.S. Cl. ........................... 430/321; 216/24; 216/26
(58) Field of Search ........................... 430/321; 216/24, 216/26

(56) References Cited

U.S. PATENT DOCUMENTS

| | | | |
|---|---|---|---|
| 5,024,726 A | * 6/1991 | Fujiwara | 216/24 |
| 5,225,039 A | * 7/1993 | Ohguri | 216/24 |
| 5,286,338 A | 2/1994 | Feldblum | |
| 5,575,878 A | 11/1996 | Cox | |
| 5,687,155 A | 11/1997 | Fukakusa et al. | |
| 5,835,458 A | 11/1998 | Bischel et al. | |
| 6,124,974 A | 9/2000 | Burger | |

FOREIGN PATENT DOCUMENTS

JP  8-082704 A  *  3/1996
JP  2000-235105 A  *  8/2000

OTHER PUBLICATIONS

Patent Abstracts of Japan, vol. 011, No. 293 (P–619), Sep. 22, 1987, & JP 62 088149 A (Hitachi Ltd.).
Nussbaum, et al., *, Proceedings of the SPIE, vol. 3226, pp. 32–43, (1997).
*Entitled: "Refractive and diffractive elements for micro–optical systems".
Ferstl, et al., **, Ann. Report 1998, Heinrich–Hertz–Institute fur Nachrichtentechnik, 109–112, 1999.
**Entitled: "Commercial Fabrication of Micro–Structures and Micro–Optical Elements for Research . . . ".
Stern, ***, Microelectronic Engineering, vol. 34, No. 3–4, pp. 299–319, (Dec. 1, 1997).
***Entitled: "Pattern transfer for diffractive and refractive microoptics".
Montamedi, et al., ****, Opt.Eng. 36(5): 1282–1297 (May 1997).
****Entitled: "Micro–opto–electro–mechanical devices and on–chip processing".
Wu, et al, "Micromechanical Photonic Integrated . . . ", IEICE Trans. Electron, vol. E83C:903–911 Jun. 2000.

* cited by examiner

*Primary Examiner*—John A. McPherson
(74) *Attorney, Agent, or Firm*—Susan S. Morse

(57) ABSTRACT

A passive optical element is transferred into a substrate already having features with a vertical dimension thereon. The features may be another passive optical element, an active optical element, a dichroic layer, a dielectric layer, alignment features, metal portions. A protective layer is provided over the feature during the transfer of the optical element. One or more of these processes may be performed on a wafer level.

31 Claims, 5 Drawing Sheets

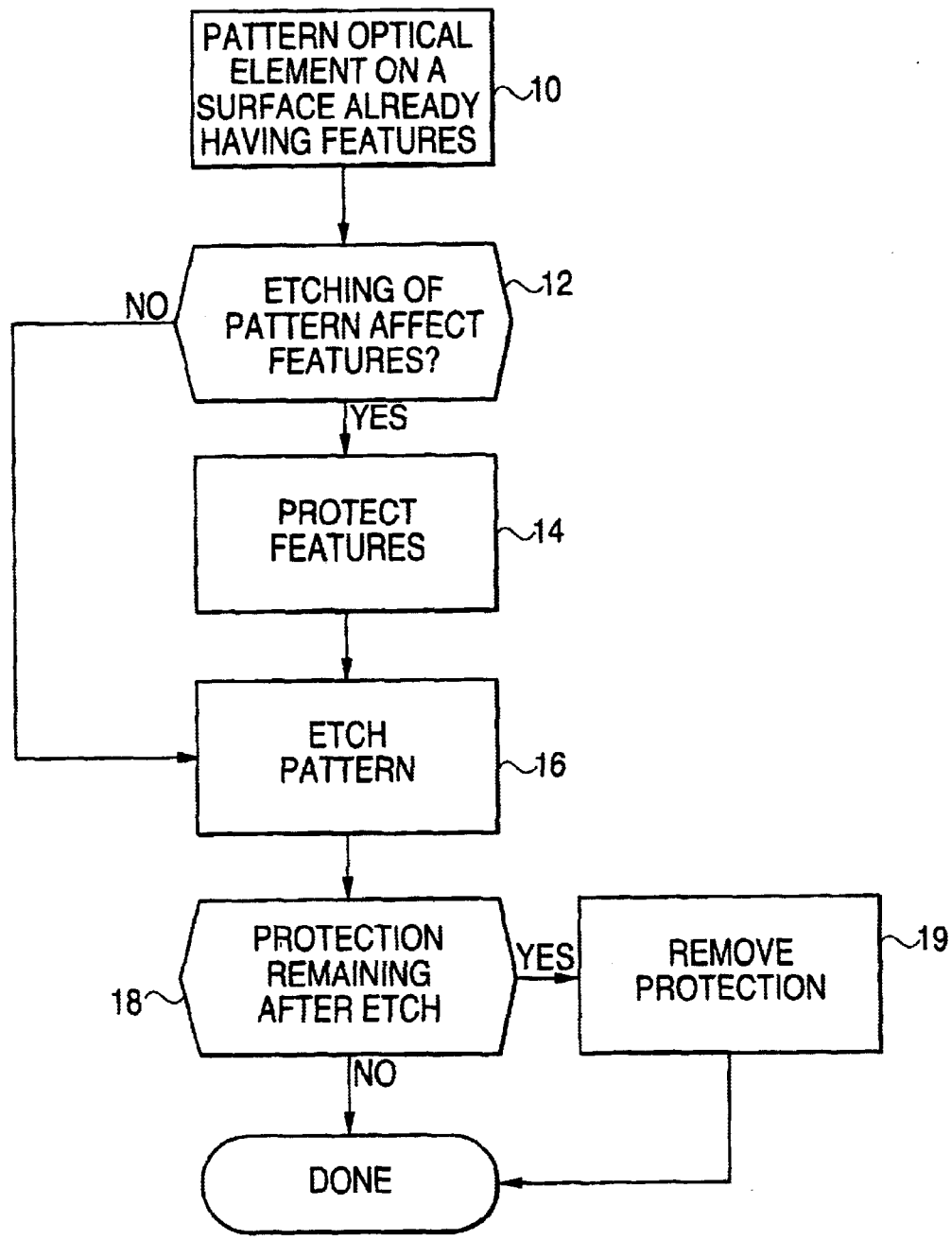

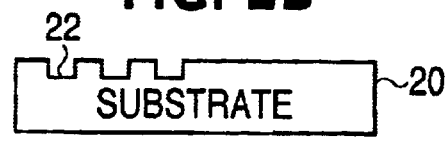
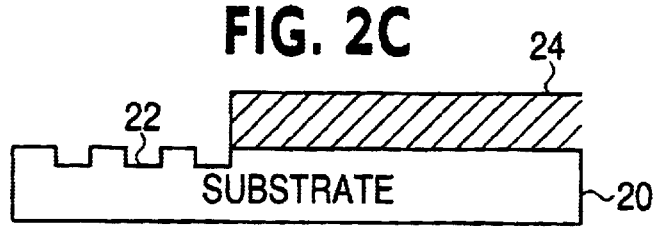
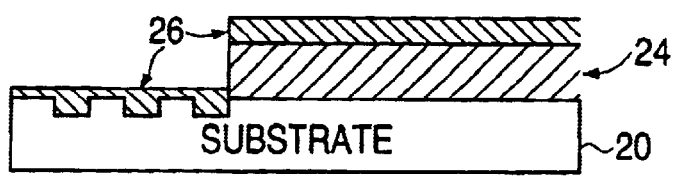
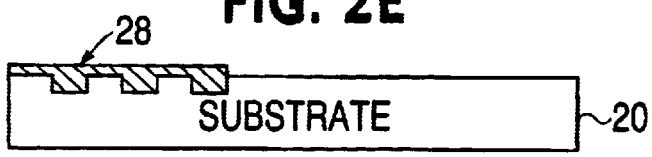
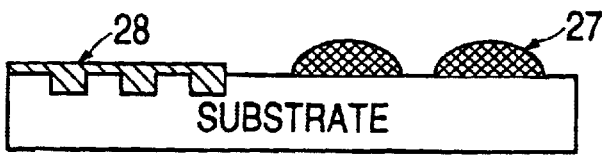

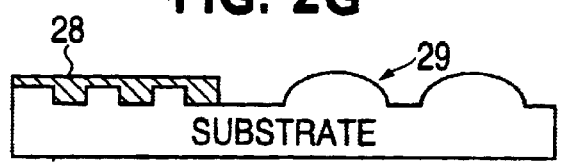
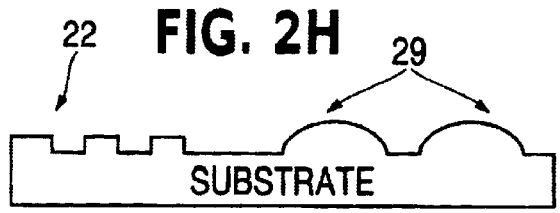
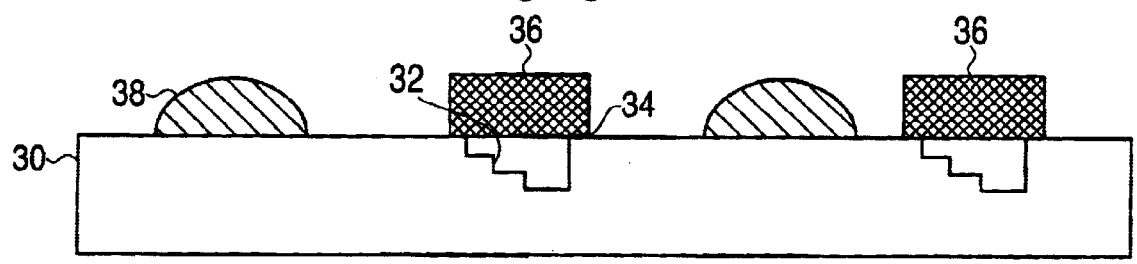

TRANSFER OF OPTICAL ELEMENT PATTERNS ON A SAME SIDE OF A SUBSTRATE ALREADY HAVING A FEATURE THEREON

CROSS-REFERENCE TO RELATED APPLICATIONS

The present application claims priority under 35 U.S.C. §119(e) to U.S. Provisional Application Ser. No. 60/330,504 entitled "Transfer of Optical Element Patterns on a Same Side of a Substrate Already Having a Feature Thereon" filed Oct. 23, 2001, the entire contents of which are hereby incorporated by reference for all purposes.

FIELD OF THE INVENTION

The present invention is directed to formation of optical elements etched into a same side of a substrate having a feature thereon, more particularly using patterning, masking and/or reflow techniques.

BACKGROUND OF THE INVENTION

Fabrication of both refractive and diffractive optical elements on the same side of a wafer is desirable for numerous applications. However, known wafer level creation techniques do not allow for high fidelity patterning of both refractive and diffractive optical elements on the same side of the wafer.

For example, if the diffractive optical element is created first, the creation of the refractive optical element will degrade the fidelity of the diffractive optical element. This degradation is due to the etching of the diffractive optical element further into the substrate that occurs during the etching of the refractive optical element.

If the refractive optical element is created first, then the high fidelity diffractive optical elements are severely degraded. Also, the topology of the refractive optical element will not allow a high quality thin photoresist layer to be spun onto the substrate. Such a high quality, i.e., uniform, thin photoresist layer is also needed to insure the creation of high fidelity diffractive optical elements. One possible solution is the use of spray coating and projection patterning, but this is not as practical as spinning the photoresist.

Thus, current lithographic techniques do not permit high fidelity patterning of both refractive and diffractive optical elements when both are to be provided on the same side of the wafer.

More generally, the above problem arises when a pattern is to be etched into a same surface already containing features which would be affected by the etch process. The larger, i.e., deeper, the feature to be etched, the more likely the etch process will effect the other features already present.

SUMMARY OF THE INVENTION

The present invention is therefore directed to providing a method of forming an optical element pattern to be etched on a surface having features already thereon, and the structures formed thereby, which substantially overcomes at least one of the above disadvantages.

It is an object of the present invention to create both refractive and diffractive optical elements in the same side of the substrate.

It is another object of the present invention to preserve features, e.g., alignment features, metallization features, active optical elements, passive optical elements, already on a surface while etching an optical element into the surface.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, aspects and advantages will be described with reference to the drawings, in which:

FIG. 1 is a flow chart of a general overview of the present invention;

FIGS. 2A–2H illustrate the process for forming a diffractive optical element and a refractive optical element on a same surface according to an embodiment of the present invention;

FIG. 3 illustrates a manner of protecting features on a substrate prior to transfer of a pattern into the substrate in accordance with the present invention;

DETAILED DESCRIPTION

Figure 4A:
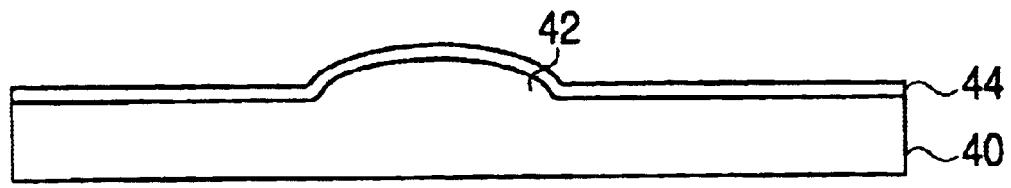
FIGS. 4A–4C illustrate different manners of protecting features on a substrate prior to transfer of a pattern into the substrate in accordance with the present invention.

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known devices and methods are omitted so as not to obscure the description of the present invention with unnecessary details. As used herein, the term "wafer" is to mean any substrate on which a plurality of components are formed which are to be separated to some degree, either individually or as arrays, prior to final use.

The method for forming an optical element on a surface already having features thereon is shown in the flow chart of FIG. 1. Generally, a pattern for forming an optical element is created in a known manner on a surface already having features thereon in step 10. These features may be any structure to be preserved either for functioning in the finished system or for use in further processing, e.g., alignment features. The pattern may be formed in any variety of manners, e.g., using a binary mask, a gray scale mask, stamping, ink jet printing, direct writing. It is then determined in step 12 whether the etching of the pattern would effect the features on the surface. As used herein, etching is to mean any manner of transferring the pattern into the substrate, e.g., plasma etching, dry etching, ion milling, wet etching. If not, for example, if the height of the pattern to be transferred to the surface is very small, e.g., at least an order of magnitude less, compared with that of the features on the surface, or otherwise does not adversely effect the features, then the flow proceeds directly to the etch 16. More typically, the etch will adversely effect the features, and the features that will be effected are protected in step 14, and then the etch is performed in step 16. After the etch at step 16 is completed, it is determined whether the protection provided in step 14 still remains on the features at step 18. If not, the creation is complete. If protection remains, this protection is removed at step 19, before completion. It is noted that step 10 and step 14 may be performed simultaneously or their order may be reversed. Further, some of the patterning and protecting in steps 10 and 14 may be performed within these steps.

A specific example of the method is shown in FIGS. 2A-2H. It is noted that the size of the substrate and the relative size of the diffractives in these figures are only increased to show the additional detail, not due to any of the processes. A blank substrate 20 is shown in FIG. 2A. The blank substrate 20 is patterned in any conventional manner to form a diffractive 145 optical element 22 thereon, as shown in FIG. 2B. A protective layer is then provided over the diffractive optical element 22. This protective layer should be resistant to the etching to be performed in transferring the refractive structure into the substrate 20. The protective layer should also be able to be removed by a process that does not affect the substrate material.

In the specific example shown here, a lift-off photoresist layer 24 is patterned to be on the non-diffractive optical element portion of the substrate 20, as shown in FIG. 2C. A resistant material 26 is then provided over the substrate 20, as shown in FIG. 2D. The photoresist 24 is then lifted off the non-diffractive optical element portion of the substrate 20, taking the unneeded portion of the resistant material 26 with it. A resultant protective layer 28 covering the diffractive optical element 22 is shown in FIG. 2E. Other manners of patterning the resistant material 26, such as using a mask, may also be employed to form the protective layer 28.

Refractive structures 27 which are to be transferred into the substrate 20 are then formed on the substrate 20 as shown in FIG. 2F. These refractive structures 27 may be formed in conventional manners, e.g., patterning photoresist and reflowing the photoresist, using gray scale masks, stamping or direct write. The refractive structures 27 are then transferred into the substrate 20, using a process which may not completely remove the protective layer 28, to form the refractive optical elements 29 as shown in FIG. 2G. Finally, the protective layer 28 is removed, resulting in refractive and diffractive optical elements being formed on the same side of the substrate 20.

The protection of the features already present on the surface at step 14 may be realized in a number of manners, depending upon the pattern to be etched, the etching to be performed, and the features to be protected. For example, if the feature is below or a flat layer on the surface to be etched, a protective material that is resistant to the etch process, but may be removed from the surface without affecting the underlying structure, may be bonded over the features to be protected. In the example shown in FIG. 3, a substrate 30 has a diffractive structure 32 therein and a patterned layer 34, e.g., a metal, an anti-reflection coating, a thin film filter, a dielectric layer, a dichroic layer, which is to remain on the surface of the substrate. It is noted that metal may serve an optical function, e.g., an aperture stop, a reflector, and/or an electrical function, e.g., input, output or contact. These features 32, 34 are covered by protective portions 36. This may be realized using a die bonder for individual protective portions or may be realized using a wafer of the protective material with holes therethrough to permit the etching of a pattern for a refractive optical element 38. Alignment tolerances may be realized by oversizing the protective portions. The pattern for a refractive optical element 38 is formed on the substrate, e.g., before the protective portions are provided. One possible material for the protective portions is $CaF_2$, which is resistant to fluorine and oxygen, which are commonly used in etching. $CaF_2$ may be wet etched in ammonium fluoride, which does not damage the underlying substrate, when the substrate is, for example, fused silica or silicon.

Figure 4B:
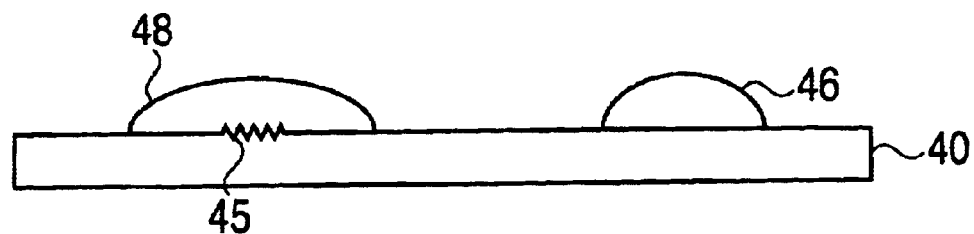

Alternatively, the protection may be provided by patterning a protective material, e.g., photoresist, over the features. This protective layer may be the same photoresist layer to be used in the formation of the optical element, as shown in FIGS. 4A and 4B. In FIG. 4A, a photoresist layer 44 is provided, e.g., screen printed, sprayed, spin coated, or plated, over a refractive optical element 42 on a substrate 40. This photoresist layer 44 is then patterned and etched to form a diffractive optical element. The refractive element 42 is protected during etch by the photoresist layer 44. In FIG. 4B, a photoresist layer 46 used to form a refractive optical element is also patterned to remain over the feature 45, here a diffractive optical element, to form a protective photoresist 48. The photoresist pattern 46 is then reflowed to form the lens. The protective photoresist 48 over the feature 45 is also reflowed. Then, the protective photoresist 48 on the feature 45 is etched away as the refractive optical pattern is etched into the substrate 40. Any remaining protective portion may be removed, e.g., by chemical etching.

However, when the protective photoresist 48 covering the feature 45 is larger, i.e., wider, than the pattern 46 for the refractive optical element while having the same thickness, reflow may result in a lower profile for the protective photoresist 48 over the feature 45 than that for the refractive optical element 46. Then, when etched, the protective photoresist 48 over the feature 45 is removed before the etch of the refractive optical element is complete. Thus, the feature 45 may still be damaged during the transfer. One solution to this problem would be to use a gray scale mask or other technique to leave a thicker photoresist over the feature, so that after reflow, sufficient height remains that the feature is protected during etch. However, using a reflowed protective photoresist also can result in undesired etching around the outer regions of the protective photoresist.

Figure 4C:
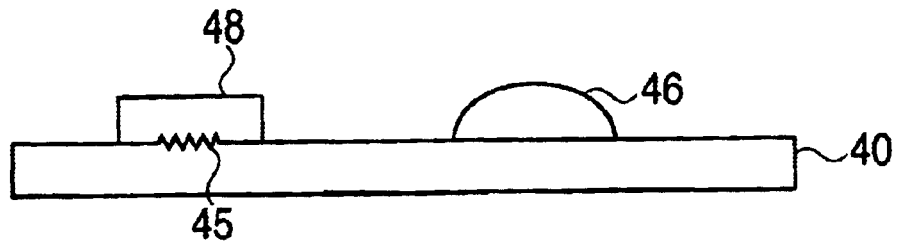

A solution to this is shown in FIG. 4C, in which a protective photoresist 48 and a refractive photoresist are provided and patterned in either order on the substrate 40. Here, the protective photoresist 48 is a photoresist which does not reflow under the same conditions as the refractive photoresist 46. So, when the substrate 40 is subjected to reflow, only the refractive photoresist 46 reflows. The refractive photoresist 46 and the protective photoresist 48 may have the same etch rate, so most of the protective photoresist 48 may have been removed after the etch of the refractive photoresist 46 is complete. Any subsequent complete removal of the protective photoresist may be realized. Alternatively, the refractive pattern could be formed using techniques that do not require reflow, e.g., gray scale masks, stamping, to eliminate the attendant problems of a reflowed protective photoresist.

Figure 5A:
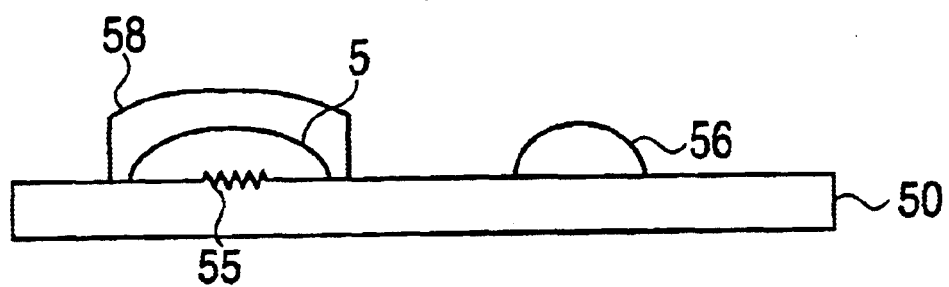
FIGS. 5A–5C illustrate different manners of protecting features on a substrate prior to transfer of a pattern into the substrate in accordance with the present invention.

Another solution to this problem is shown in FIG. 5A, in which further photoresist 58 is provided over reflowed protective photoresist 54 covering the feature 55 on the substrate 50. The refractive photoresist pattern 56 may be silated, or otherwise stabilized, to allow for the additional photoresist 58 to be patterned without affecting the refractive pattern 56.

Figure 5B:
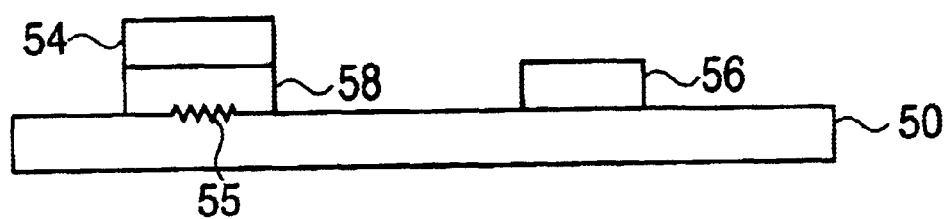

Another solution is shown in FIG. 5B, in which a protective photoresist layer 58 is patterned to cover a feature 55 on a substrate 50, and then another photoresist layer 54 in which the refractive pattern is to be formed is provided over this layer, e.g., by spinning, and again patterned to remain over the first protective layer 58 and to serve as the refractive pattern 56. After the refractive pattern 56 is reflowed, sufficient protection remains over the feature 55 to protect it during etch. The first protective photoresist may be the same photoresist, may be a photoresist which is more resistant to the etch than the photoresist, or may be less resistant to the etch than the refractive photoresist 56. If the protective photoresist layer 58 is less or equally resistant to the etch, sufficient height of the protective photoresist 58 would need to be provided. It is noted that providing a thicker protective layer than the refractive pattern may distort the transfer of the refractive photoresist, due to loading during etching. Further, if the photoresists are different, once the photoresist layer 54 over the feature 55 is etched away, the etch selectivity shifts dramatically, effecting the transfer of the refractive element 56.

Figure 5C:
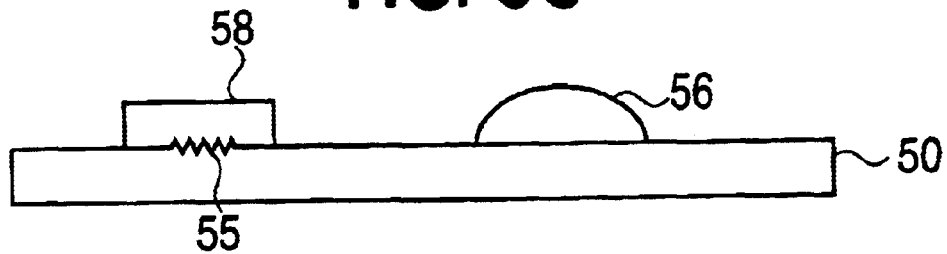

Yet another solution is shown in FIG. 5C, where a protective photoresist 58 is to provided over a feature 55 on the substrate 50 after the photoresist 56 for the refractive element has been patterned, reflowed, and stabilized, if necessary. Again, the protective photoresist 58 may be the same photoresist, may be a photoresist which is more resistant to the etch than the photoresist, or may be less or equally resistant to the etch than the refractive photoresist layer 56. If the protective photoresist layer 58 is less resistant to the etch, sufficient height of the protective photoresist 58 would need to be provided to insure protection of the feature 55.

At least one of the above steps in the process, e.g., the formation of the pattern, the provision of protection, and the transfer of the pattern, is performed on a wafer level. The wafer may then be diced to form individual systems.

It will be obvious that the invention may be varied in a plurality of ways. Such variations are not to be regarded as a departure from the scope of the invention. All such modifications as would be obvious to one skilled in the art are intended to be included within the scope of the present invention.

What is claimed is:

1. A method of forming a refractive optical element on a first surface of a substrate already having diffractive optical element thereon, the method comprising:

creating a pattern for the refractive optical element on the first surface of the substrate, in a separate portion of the substrate from the diffractive optical element;

providing a protective layer over the diffractive optical element;

transferring the pattern into the substrate using an analog etch to form the refractive optical element, the protective layer protecting the diffractive optical element during the transferring; and removing the protective layer.

2. The method as claimed in claim 1, wherein the providing the protective layer includes providing a layer more resistant to the analog etch than the pattern.

3. The method as claimed in claim 1, wherein the providing the protective layer includes providing a layer of a same material as the pattern that is thicker than the pattern.

4. The method as claimed in claim 1, wherein the providing the protective layer includes providing a layer less resistant to the analog etch than the pattern, the layer being thicker than the pattern.

5. The method as claimed in claim 1, wherein the providing the protective layer includes providing a layer having a same material as the substrate.

6. The method as claimed in claim 1, wherein the creating and providing are simultaneous.

7. The method as claimed in claim 1, wherein the creating occurs after the providing.

8. The method as claimed in claim 1, wherein the removing occurs during the transferring.

9. The method as claimed in claim 1, further comprising stabilizing the pattern.

10. The method as claimed in claim 1, wherein the creating the pattern for the refractive optical element includes reflowing photoresist.

11. The method as claimed in claim 10, wherein the providing the protective layer includes providing a layer which maintains substantially all of its vertical dimension during the reflowing.

12. The method as claimed in claim 1, wherein the providing a protective layer includes providing a lift off layer over a region in which the refractive optical element is to be formed, providing the protective layer over the first surface, and lifting off the protective layer in the region.

13. The method as claimed in claim 1, further comprising alignment feature on the first surface.

14. The method as claimed in claim 1, further comprising electro-optical elements on the first surface.

15. The method as claimed in claim 1, further comprising metal portions on the first surface.

16. The method as claimed in claim 1, further comprising one of dichroic portions and dielectric portions on the first surface.

17. The method as claimed in claim 1, wherein the providing the protective layer includes die bonding protective portions over the diffractive optical element.

18. A method of making different optical elements on a first surface of a substrate, the method comprising:

forming a refractive optical element on the first surface of the substrate;

creating a pattern for a diffractive optical element on the first surface of the substrate, in a separate portion of the substrate from the refractive optical element;

providing a protective layer over the refractive optical element;

transferring the pattern into the substrate to form the diffractive optical element, the protective layer protecting the refractive optical element during the transferring; and removing the protective layer.

19. The method as claimed in claim 18, wherein the providing the protective layer includes providing a layer more resistant to the etch than the pattern.

20. The method as claimed in claim 18, wherein the providing the protective layer includes providing a layer of a same material as the pattern that is thicker than the pattern.

21. The method as claimed in claim 18, wherein the providing the protective layer includes providing a layer less resistant to the etch than the pattern, the layer being thicker than the pattern.

22. The method as claimed in claimed 18, wherein the providing the protective layer includes providing a layer having a same material as the substrate.

23. The method as claimed in claim 18, wherein the creating occurs after the providing.

24. The method as claimed in claim 18, wherein the removing occurs during the transferring.

25. The method as claimed in claim 18, further comprising stabilizing the pattern.

26. The method as claimed in claim 18, wherein the creating the pattern for the diffractive optical element includes coating the first surface with a photoresist.

27. The method as claimed in claim 26, wherein the providing the protective layer is achieved with the coating.

28. The method as claimed in claim 26, wherein the coating includes one of spray coating and solvent assisted coating.

29. The method as claimed in claim 26, wherein the providing the protective layer includes die bonding protective portions over the refractive optical element.

30. A method of making different optical elements on a first surface of a substrate, the method comprising:
  forming a diffractive optical element on the first surface of the substrate;
  creating a pattern for a refractive optical element on the first surface of the substrate, in a separate portion of the substrate from the diffractive optical element;
  providing a protective layer over the diffractive optical element;
  transferring the pattern into the substrate to form the refractive optical element, the protective layer protecting the diffractive optical element during the transferring; and removing the protective layer.

31. The method as claimed in claim 30, wherein the creating the pattern for the refractive optical element includes reflowing photoresist.

* * * * *